(12) United States Patent
Du

(10) Patent No.: US 11,570,909 B2
(45) Date of Patent: Jan. 31, 2023

(54) FLEXIBLE DISPLAY APPARATUS AND METHOD OF MANUFACTURING THE SAME

(71) Applicant: BOE TECHNOLOGY GROUP CO., LTD., Beijing (CN)

(72) Inventor: Shuang Du, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 52 days.

(21) Appl. No.: 16/904,388

(22) Filed: Jun. 17, 2020

(65) Prior Publication Data
US 2020/0413551 A1 Dec. 31, 2020

(30) Foreign Application Priority Data

Jun. 28, 2019 (CN) .......................... 201910572618.8

(51) Int. Cl.
| H05K 5/00 | (2006.01) |
| B32B 7/12 | (2006.01) |
| B32B 27/08 | (2006.01) |
| B32B 37/12 | (2006.01) |
| H01L 51/00 | (2006.01) |
| H01L 51/56 | (2006.01) |
| H01L 27/32 | (2006.01) |

(52) U.S. Cl.
CPC ............ *H05K 5/0017* (2013.01); *B32B 7/12* (2013.01); *B32B 27/08* (2013.01); *B32B 37/12* (2013.01); *H01L 51/0097* (2013.01); *H01L 51/56* (2013.01); *B32B 2037/1253* (2013.01); *B32B 2457/206* (2013.01); *H01L 27/3244* (2013.01); *H01L 2251/5338* (2013.01)

(58) Field of Classification Search
CPC .......... H05K 5/00; H05K 51/00; H05K 51/56; B32B 7/12; B32B 27/08; B32B 37/12
USPC ........................................................ 428/214
See application file for complete search history.

(56) References Cited

U.S. PATENT DOCUMENTS

2013/0045369 A1     2/2013  Takemura et al.
2013/0302619 A1 *  11/2013  Wei .................. B32B 37/144
                                            428/411.1
(Continued)

FOREIGN PATENT DOCUMENTS

CN        107221606 A      9/2017
CN        108034373 A  *   5/2018  ................ C09J 7/22
(Continued)

OTHER PUBLICATIONS

Office Action for related CN Application No. 201910572618.8 dated Jan. 12, 2021.

*Primary Examiner* — Tahseen Khan
(74) *Attorney, Agent, or Firm* — Procopio, Cory, Hargreaves & Savitch LLP

(57) ABSTRACT

A flexible display apparatus includes at least two flexible elements, and at least one adhesive layer bonding the at least two flexible elements. The flexible display apparatus has a bendable region, each adhesive layer includes a first portion in the bendable region and a second portion, and at least part of the second portion is located outside the bendable region. The adhesive layer is configured such that at a same temperature, a storage modulus of the first portion is greater than a storage modulus of the second portion. A thickness of the first portion is less than or equal to a thickness of the adhesive layer.

19 Claims, 13 Drawing Sheets

(56) References Cited

U.S. PATENT DOCUMENTS

| | | | |
|---|---|---|---|
| 2017/0271616 A1* | 9/2017 | Choi | .................. H01L 51/0097 |
| 2019/0392737 A1 | 12/2019 | Du et al. | |
| 2020/0058899 A1* | 2/2020 | Bu | .................. G02F 1/133308 |
| 2020/0251025 A1 | 8/2020 | Li et al. | |
| 2021/0139747 A1* | 5/2021 | Du | .......................... C09J 11/08 |

FOREIGN PATENT DOCUMENTS

| | | | | | |
|---|---|---|---|---|---|
| CN | 108461519 A | | 8/2018 | | |
| CN | 208240297 U | | 12/2018 | | |
| CN | 109135593 A | * | 1/2019 | ........... | H01L 51/524 |
| CN | 109135593 A | | 1/2019 | | |
| JP | 2019064086 A | | 4/2019 | | |

* cited by examiner

FLEXIBLE DISPLAY APPARATUS AND METHOD OF MANUFACTURING THE SAME

CROSS-REFERENCE TO RELATED APPLICATION

This application claims priority to and the benefit of Chinese Patent Application 201910572618.8, filed on Jun. 28, 2019, which is incorporated herein by reference in its entirety.

TECHNICAL FIELD

The present disclosure relates to the field of display technologies, and in particular, to a flexible display apparatus and a method of manufacturing the same.

BACKGROUND

At present, as people's demand for diversified products grows, flexible display apparatuses have attracted more and more attention due to their deformable and bendable characteristics.

SUMMARY

Some embodiments of the present disclosure provide a flexible display apparatus. The flexible display apparatus includes at least two flexible elements and at least one adhesive layer bonding the at least two flexible elements. The flexible display apparatus has a bendable region, each adhesive layer includes a first portion in the bendable region and a second portion, at least part of the second portion is located outside the bendable region. The adhesive layer is configured such that at a same temperature, a storage modulus of the first portion is greater than a storage modulus of the second portion. A thickness of the first portion is less than or equal to a thickness of the adhesive layer.

In some embodiments, the at least two flexible elements include at least three flexible elements, and the at least one adhesive layer includes a plurality of adhesive layers. Every two adjacent flexible elements are provided with one of the plurality of adhesive layers therebetween.

In some embodiments, an orthographic projection of the first portion on one of the at least two flexible elements and an orthographic projection of the bendable region on the one of the at least two flexible elements coincide. Or, the first portion includes a plurality of sub-portions arranged at intervals, and orthographic projections of the plurality of sub-portions on the one of the at least two flexible elements are within the orthographic projection of the bondable region on the one of the at least two flexible elements.

In some embodiments, the plurality of sub-portions are arranged in an array.

In some embodiments, one of the at least one adhesive layer has a single-layer structure and the thickness of the first portion is less than the thickness of the adhesive layer. The first portion is located in at least one of an upper half region and a lower half region of the one of the at least one adhesive layer.

In some embodiments, one of the at least one adhesive layer has a multi-layer structure and includes a plurality of adhesive sub-layers that are stacked along a thickness direction of the adhesive layer; and at least one adhesive sub-layer includes the first portion.

In some embodiments, in the plurality of adhesive sub-layers, an adhesive sub-layer including the first portion and an adhesive sub-layer not including the first portion are arranged alternately.

In some embodiments, the plurality of adhesive sub-layers include a first adhesive sub-layer and a second adhesive sub-layer that are stacked along the thickness direction of the adhesive layer. One of the first adhesive sub-layer and the second adhesive sub-layer includes the first portion, and a sum of thicknesses of the first adhesive sub-layer and the second adhesive sub-layer is less than or equal to approximately 100 microns, and more than or equal to 15 microns.

In some embodiments, the first adhesive sub-layer includes the first portion, a thickness of the first adhesive sub-layer is greater than a thickness of the second adhesive sub-layer, and a thickness of the second adhesive sub-layer is in a range from approximately 5 microns to approximately 15 microns. Or, the second adhesive sub-layer includes the first portion, the thickness of the second adhesive sub-layer is greater than the thickness of the first adhesive sub-layer, and the thickness of the first adhesive sub-layer is in a range from approximately 5 microns to approximately 15 microns.

In some embodiments, the first portion is configured such that the storage modulus of the first portion is in a range from approximately 100 KPa to approximately 200 KPa at 25° C.; and the second portion is configured such that the storage modulus of the second portion is in a range from approximately 20 KPa to approximately 100 KPa at 25° C.

In some embodiments, an adhesive strength of the first portion is greater than an adhesive strength of the second portion.

In some embodiments, the adhesive strength of the first portion is in a range from approximately 2000 gf/inch to approximately 4000 gf/inch; and the adhesive strength of the second portion is in a range from approximately 1500 gf/inch to approximately 3000 gf/inch.

In some embodiments, a glass transition temperature of the adhesive layer is less than or equal to −30° C., and more than or equal to −45° C.

In some embodiments, a light transmittance of the adhesive layer is greater than or equal to approximately 93%, and a haze of the adhesive layer is less than or equal to approximately 1%.

Some embodiments of the present disclosure provide a method of manufacturing the flexible display apparatus described above. The method includes: forming the at least one adhesive layer which includes the first portion; and bonding the at least two flexible elements through the at least one adhesive layer. Forming the at least one adhesive layer includes: forming the first portion through curing by using energy irradiation, so that at a same temperature, a storage modulus of the first portion is greater than a storage modulus of the second portion, and a thickness of the first portion is less than or equal to a thickness of the adhesive layer.

In some embodiments, forming the first portion through curing by using energy irradiation includes: forming an optical adhesive film; curing a portion of the optical adhesive film through UV curing, so as to form the first portion.

In some embodiments, curing a portion of the optical adhesive film through UV curing includes: curing the portion of the optical adhesive film through UV curing by using a mask having at least one opening which corresponds to the first portion to be formed in an inert gas atmosphere, so as to form the first portion.

In some embodiments, forming the adhesive layer includes: forming a base material layer; and adding different proportions of photo initiators to a portion of the base material layer corresponding to the first portion to be formed and a portion of the base material layer corresponding to the second portion to be formed. The base material layer includes at least one of acrylic resin, polyurethane resin, epoxy polyester resin, or silicone resin. The photo initiators include at least one of 1-hydroxycyclohexylphenylketone, benzoin dimethyl ether, 2-hydroxy-2-methylpropiophenone, benzophenone, 2,4,6-trimethylanisole diphenyl phosphine oxide, methyl phenylglyoxylate, phenyl bis (2,4,6-trimethylbenzoyl)-phosphine oxide, or isopropyl thioxanthone.

In some embodiments, forming the adhesive layer includes: forming a first optical adhesive sub-film; curing a portion of the first optical adhesive sub-film corresponding to the first portion to be formed by energy irradiation to form a first adhesive sub-layer including the first portion; and forming a second adhesive sub-layer on the first adhesive sub-layer.

In some embodiments, forming one of the at least one adhesive layer includes: forming a first optical adhesive sub-layer; forming a second optical adhesive sub-film on the first adhesive sub-layer; and curing a portion of the second optical adhesive sub-film corresponding to the first portion to be formed by energy irradiation to form a second adhesive sub-layer including the first portion.

BRIEF DESCRIPTION OF THE DRAWINGS

In order to describe technical solutions in embodiments of the present disclosure more clearly, the accompanying drawings to be used in the description of the embodiments will be introduced briefly. However, the accompanying drawings to be described below are merely some embodiments of the present disclosure, and a person of ordinary skill in the art may obtain other drawings according to these drawings without paying any creative effort.

DETAILED DESCRIPTION

Figure 1A:
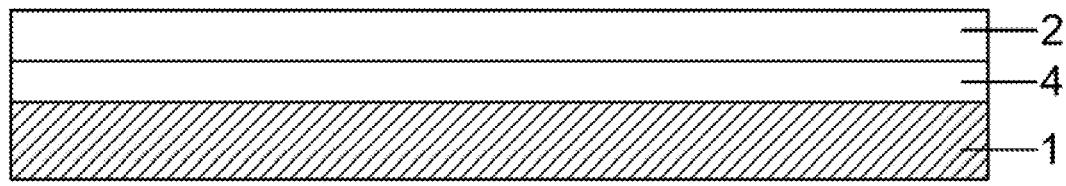
FIG. 1A is a schematic sectional view of a flexible display apparatus, according to some embodiments.

The technical solutions in some embodiments of the present disclosure will be described clearly and completely in combination with the accompanying drawings in the embodiments of the present disclosure below. Obviously, the described embodiments are merely some but not all of the embodiments of the present disclosure. All other embodiments obtained based on the embodiments of the present disclosure by a person of ordinary skill in the art without paying any creative effort shall be included in the protection scope of the present disclosure.

Unless the context requires otherwise, term "comprise", and other forms thereof such as the third-person singular form "comprises" and the present participle form "comprising" in the description and the claims are construed to be open and inclusive, meaning "including, but not limited to".

In the description of the specification, terms such as "one embodiment", "some embodiments", "exemplary embodiments", "example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

In the description of embodiments of the present disclosure, it will be understood that orientations or positional relationships indicated by terms "center", "upper", "lower", "front", "rear", "left", "right", "vertical", "horizontal", "top", "bottom", "inner", "outer", etc. are based on orientations or positional relationships shown in the drawings, and are merely used to facilitate and simplify the description of the present disclosure, and do not indicate or imply that the referred devices or elements must have a particular orientation, or must be constructed or operated in a particular orientation. Therefore they should not be construed as limitations to the present disclosure.

In the description of the embodiments of the present disclosure, term "a/the plurality of" means two or more unless otherwise specified. Terms such as "first" and "second" are used for descriptive purposes only, and are not to be construed as indicating or implying the relative importance or implicitly indicating the number of indicated technical features.

In the descriptions of some embodiments of the present disclosure, it will be understood that when A is referred to as being "on" B, it may include the following two situations: (1) A is directly on B, which means there is nothing else between A and B; (2) A is indirectly on B, which means there is at least a C between A and B. Here, A, B and C may be a component, a substrate, a frame, a layer or a pattern in a display apparatus. "A and/or B" includes the following combinations of A and B: only A, only B, and a combination of A and B.

It will be understood that "approximately" as used in some embodiments of the present disclosure is inclusive of the stated value and means within an acceptable range of deviation for the particular value as determined by one of ordinary skill in the art, considering the measurement in question and the error associated with measurement of the particular quantity (i.e., the limitations of the measurement system).

Figure 1B:
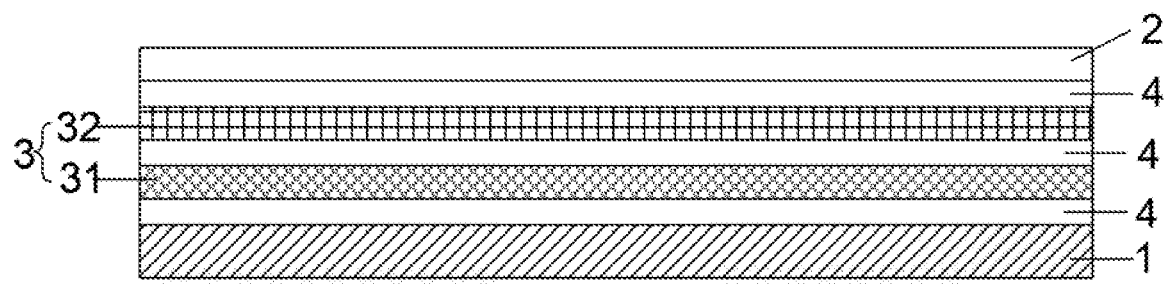
FIG. 1B is a schematic sectional view of another flexible display apparatus, according to some embodiments.

Some embodiments of the present disclosure provide a flexible display apparatus. As shown in FIGS. 1A and 1B, the flexible display apparatus includes at least two flexible elements and at least one adhesive layer 4. For example, as shown in FIG. 1A, the at least two flexible elements include a flexible display panel 1 and at least one flexible layer (such as a protective layer 2). For another example, as shown in FIG. 1B, the at least two flexible elements include at least two flexible layers (such as the protective layer 2 and functional layers 3).

Herein, the at least one layer means one or more layers, and at least two layers, a plurality of or multiple layers means two or more layers unless otherwise specified.

For example, as shown in FIG. 1A, the at least one flexible layer includes a protective layer 2 on the flexible display panel 1. The protective layer 2 may be made of a transparent material such as flexible glass, transparent plastic or transparent resin. The flexible display panel 1 and the protective layer 2 are bonded by the adhesive layer 4.

For another example, as shown in FIG. 1B, the at least one flexible layer may further include the functional layers 3 provided between the flexible display panel 1 and the protective layer 2. The functional layers 3 may include multiple layers arranged in a thickness direction of the flexible display apparatus. For example, as shown in FIG. 1B, the functional layers 3 include an optical film 31 (such as a polarizer) and a touch layer 32. The flexible display panel 1 and the optical film 31 are bonded by the adhesive layer 4, the optical film 31 and the touch layer 32 are bonded by the adhesive layer 4, and the touch layer 32 and the protective layer 2 are bonded by the adhesive layer 4.

For another example, as shown in FIG. 1B, the at least two flexible layers include the protective layer 2, the optical film 31 and the touch layer 32. The optical film 31 and the touch layer 32 are bonded by the adhesive layer 4, and the touch layer 32 and the protective layer 2 are bonded by the adhesive layer 4.

The flexible display panel 1 may be a top-emitting display panel, a bottom-emitting display panel or a double-sided light-emitting display panel. For example, as shown in FIG. 1B, the flexible display panel 1 is the top-emitting display panel, and in a direction pointing to the protective layer 2 from the flexible display panel 1, the functional layers 3 and the protective layer 2 are sequentially arranged on the display side of the flexible display panel 1.

Figure 2:
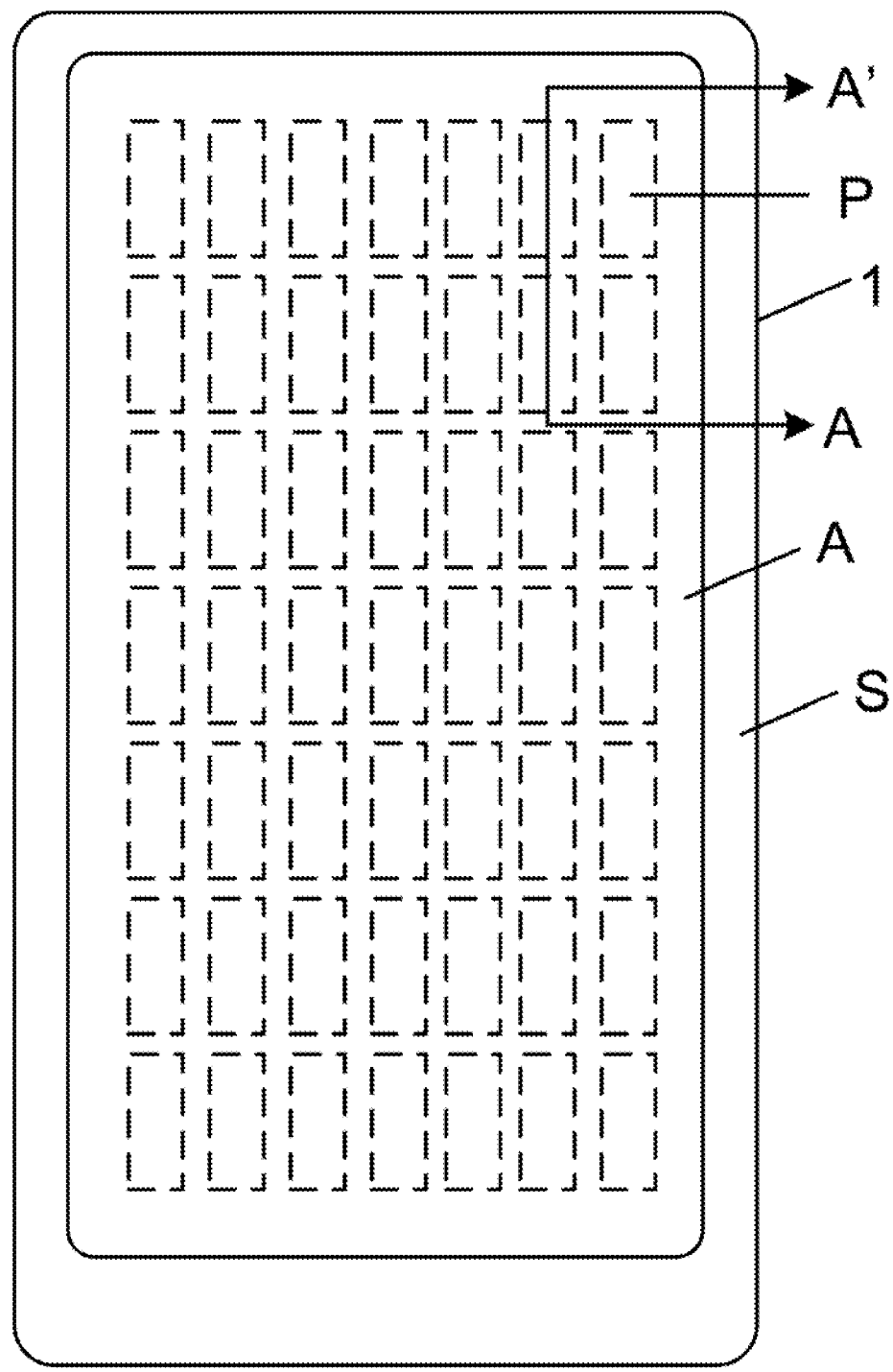
FIG. 2 is a schematic top view of a flexible display panel, according to some embodiments.

FIG. 2 is a schematic top view of a flexible display panel 1 according to some embodiments. As shown in FIG. 2, the flexible display panel 1 includes an active area A and a peripheral area S located on at least one side of the active area A. For example, in a case where the active area A is in a shape of a quadrilateral (e.g., a rectangle), the peripheral area S is arranged to surround the active area A, and the peripheral area S may be in a shape of a ring (e.g., a rectangular ring). The shapes of the active area A and the peripheral area S are not limited thereto, and the shape of the peripheral region S may change as the shape of the active area A changes. The flexible display panel 1 includes a plurality of sub-pixels P located in the active area A, and the number and arrangement manner of the plurality of sub-pixels P are not limited to the examples shown in the accompanying drawings. The flexible display panel 1 may further include electronic components, wires or lines arranged in the peripheral region S. For example, the electronic components include driving circuits such as a power IC, a timing control (TCON) IC, a source driver IC and a gate driver IC.

For example, the flexible display panel 1 may be an electroluminescent display panel or a photoluminescence display panel. The electroluminescent display panel may be an organic light-emitting diode (OLED) display panel or a quantum dot light-emitting diode (QLED) display panel.

Figure 3:
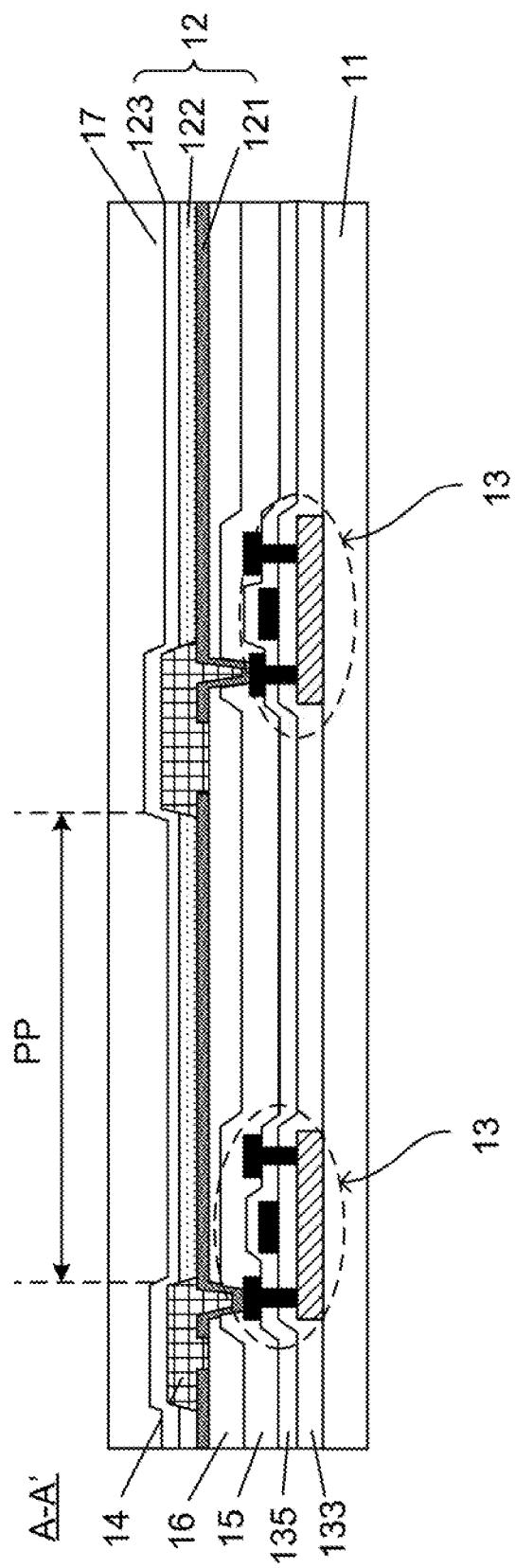
FIG. 3 is a schematic sectional view taken along direction A-A' of the flexible display panel shown in FIG. 2.
Figure 4:
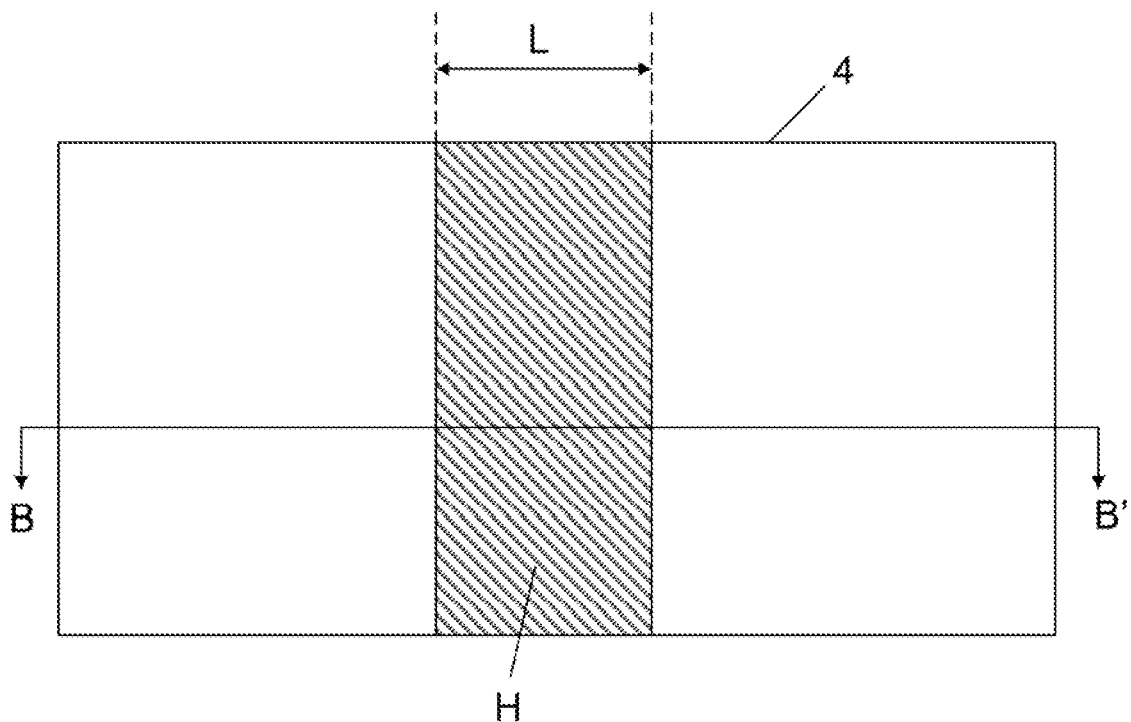
FIG. 4 is a schematic top view of a display apparatus, according to some embodiments.

In some embodiments, as shown in FIGS. 2 and 3, the flexible display panel 1 includes a flexible substrate 11 and the plurality of sub-pixels P on the flexible substrate 11. Each sub-pixel P includes a pixel driving circuit and a light-emitting device 12. The pixel driving circuit includes a plurality of thin film transistors and at least one capacitor. The plurality of thin film transistors include a driving transistor 13 and at least one switching transistor. A drain or a source of the driving transistor 13 is electrically connected to an anode 121 of the light-emitting device 12.

The pixel driving circuit may have a "2T1C", "6T1C", "7T1C", "6T2C", or "7T2C" structure. Herein, "T" indicates a thin film transistor, and the number before "T" indicates the number of the plurality of thin film transistors in the pixel driving circuit; "C" indicates a capacitor, and the number before "C" indicates the number of the at least one capacitor in the pixel driving circuit. For example, the pixel driving circuit with the 2T1C structure includes two thin film transistors and one capacitor.

The flexible substrate 11 is made of a flexible material. For example, the flexible material includes at least one of polyethylene terephthalate (PET), polyethylene naphthalate two formic acid glycol ester (PEN) or a polyimide (PI).

As shown in FIG. 3, the flexible display panel 1 further includes a pixel defining layer 14. The pixel defining layer 14 includes a plurality of openings PP, and one light-emitting device 12 corresponds to an opening PP.

The light-emitting device 12 includes the anode 121, a cathode 123 and a light-emitting functional layer 122 between the anode 121 and the cathode 123. The light-emitting functional layer 122 includes at least a light-emitting layer. In some embodiments, the light-emitting functional layer 122 further includes at least one of an electron injection layer (EIL), an electron transporting layer (ETL), a hole transporting layer (HTL) or a hole injection layer (HIL). If the light-emitting function layer 122 includes the EIL, the ETL, the light-emitting layer, the HTL and the HIL, all the layers are stacked sequentially.

The light-emitting device 12 may be a top-emitting device. In this case, the anode 121 is opaque. The anode 12 may have a multiple-layer structure, and may be composed of at least one indium tin oxide (ITO) layer and at least one silver (Ag) layer. For example, the anode 12 has an ITO-Ag-ITO structure. The cathode 123 may be transparent or translucent. For example, the cathode 123 is a silver sheet which is thin enough to be transparent or translucent.

In addition, as shown in FIG. 3, the flexible display panel 1 further includes, for example, a passivation layer 15 and a planarization layer 16 provided between the driving transistor 13 and the anode 121.

With continued reference to FIG. 3, the flexible display panel 1 may further include an encapsulation layer 17 for encapsulating the light-emitting device 12. The encapsulation layer 17 may be an encapsulation film.

In some embodiments, as shown in FIGS. 4 to 7, the flexible display apparatus has a bendable region L. The adhesive layer 4 includes a first portion H in the bendable region L, and a second portion. At least part of the second portion is located outside the bendable region L (as shown by the dotted boxes in FIGS. 5 and 7). The adhesive layer 4 is configured such that at a same temperature, a storage modulus of the first portion H is greater than a storage modulus of the second portion. A thickness d1 of the first portion H is less than or equal to a thickness D of the adhesive layer 4.

The storage modulus is a physical quantity used to characterize an ability of a solid material's resistance to deformation. A material with a high storage modulus has high rigidity and is difficult to bend or stretch. In addition, it is easier for the material with the high storage modulus to restore to an original state after a force that bends or stretches the material is eliminated.

Figure 9:
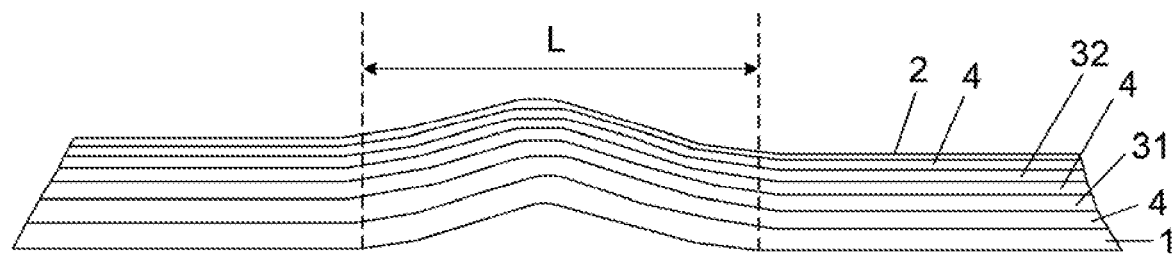
FIG. 9 is a schematic sectional view of the flexible display apparatus shown in FIG. 8 after it is unfolded, according to the related art.

It will be noted that in a case where the adhesive layer 4 does not include the first portion H, if the adhesive layer 4 has a relatively high storage modulus at any position, the bendable portion of the flexible display apparatus in the bendable region L may be hard to be bent, which may cause the flexible display apparatus hard to be bent. If the adhesive layer 4 has a relatively low storage modulus at any position, that is, the adhesive layer 4 has relatively high flexibility at any position, as shown in FIG. 9, it is difficult for the bendable portion of the flexible display apparatus to restore to the original state after being bent, which may cause unevenness of the flexible display apparatus.

In the flexible display apparatus provided in the embodiments of the present disclosure, the adhesive layer 4 includes the first portion H in the bendable region L. Since at the same temperature, the storage modulus of the first portion H is greater than the storage modulus of the second portion, a rigidity of the bendable portion of the flexible display apparatus located in the bendable region L may be improved. As a result, it may be easier for the bendable portion to restore to the original state after being bent.

Besides, organic layers in the flexible display apparatus may generate gas during the deformation process (such as deformation caused by compressive stress) in a high temperature. However, in the flexible display apparatus provided in the embodiments, when gas is generated in flexible layers bonded to the first portion H (for example, the optical film 31, the touch layer 32 or the protective layer 2), since the rigidity of the first portion H is high and the first portion H is not easily deformed, the generated gas may only be discharged from a peripheral area and may not easily gather to form bubbles. In this way, it may be possible to avoid a problem of bubbles in the bendable region L when the flexible display apparatus is bent in a high temperature.

In some embodiments, the first portion H of the adhesive layer 4 is configured such that the storage modulus of the first portion H is in a range from approximately 100 KPa to approximately 200 KPa at 25° C.

In some embodiments, the second portion of the adhesive layer 4 is configured such that the storage modulus of the second portion is in a range from approximately 20 KPa to approximately 100 KPa at 25° C.

For example, the storage modulus of the first portion H of the adhesive layer 4 may be 100 KPa, 110 KPa, 120 KPa, 130 KPa, 140 KPa, 150 KPa, 160 KPa, 170 KPa, 180 KPa, 190 KPa or 200 KPa at 25° C. For example, the storage modulus of the second portion of the adhesive layer 4 may be 20 KPa, 30 KPa, 40 KPa, 50 KPa, 60 KPa, 70 KPa, 80 KPa, 90 KPa, or 100 KPa at 25° C.

In some examples, the storage modulus of the second portion of the adhesive layer 4 is in a range from approximately 30 KPa to approximately 50 KPa at 25° C.

The storage modulus of the adhesive layer 4 may be measured by using an advanced rheometric expansion system (ARES) or a discovery hybrid rheometer (DHR). During the measurement, a portion of the adhesive layer 4 having a thickness of 1 mm and a diameter of 8 nm is taken as the sample. Besides, an oscillation frequency in the measurement may be 1 Hz and the temperature in the measurement may be 25° C.

Since the first portion H is only provided in the bendable region L, and the adhesive layer 4 has the second portion with a lower storage modulus relative to the first portion H, the adhesive layer 4 still has a certain flexibility in the second portion. This design is conducive to releasing a stress generated in the first portion H during a bending process. Therefore, a bending stress on the flexible display apparatus during the bending process and a shear stress between layers of the flexible display apparatus may be reduced.

It can be understood that for an adhesive layer (for example, the adhesive layer 4), when the storage modulus increases, the adhesive strength increases. Since the storage modulus of the first portion H is greater than that of the second portion, an adhesive strength of the first portion H is greater than that of the second portion. The greater the adhesive strength, the greater the force required to peel off a layer of two layers bonded together. Herein, the unit of the adhesive strength is gram force per inch (gf/inch). In this case, since the first portion H has a greater adhesive strength than the second portion, an adhesion between the first portion H and an object to which the first portion H is adhered (for example, the at least one flexible layer or the flexible display panel 1) is better than that of the second portion. In this way, while the certain flexibility of the flexible display apparatus is ensured, it is possible to prevent a delamination problem in the bendable region L after a long-term bending of the flexible display apparatus.

In some embodiments, the first portion H and the second portion are formed by photocuring (such as UV curing). For example, by adjusting a content of the photoinitiator, the first portion H and the second portion with different degrees of curing are formed. For example, the first portion H and the second portion with different degrees of curing may be formed by controlling irradiation conditions during the curing process.

For example, the process of forming the first portion and the second portion is as follows: different proportions of photo initiators are added to a same kind of base material to form a first material and a second material, respectively, the proportion of photoinitiator in the first material being higher than that of the second material; then the first material is cured to form the first portion H with a relatively high degree of curing, and the second material is cured to form the second portion with a relatively low degree of curing. Since the degree of curing of the first portion H is higher than that of the second portion, the first portion H has a greater storage modulus and a greater adhesive strength than the second portion.

In some embodiments, the base material of both the first portion H and the second portion includes at least one of acrylic resin, polyurethane resin, epoxy polyester resin or silicone resin. The initiator may be photoinitiator selected from a group consisting of 1-hydroxycyclohexylphenylketone, benzoin dimethyl ether, 2-hydroxy-2-methylpropiophenone benzophenone, 2,4,6-trimethylanisole diphenyl phosphine oxide, methyl phenylglyoxylate, phenyl bis (2,4, 6-trimethylbenzoyl)-phosphine oxide, isopropyl thioxanthone and combinations thereof.

The adhesive strength of the first portion H and the adhesive strength of the second portion are not limited, as long as the adhesive strength of the first portion H is greater than the adhesive strength of the second portion.

In some embodiments, the adhesive strength of the first portion H is in a range from approximately 2000 gf/inch to approximately 4000 gf/inch, and the adhesive strength of the second portion of the adhesive layer 4 is in a range from approximately 1500 gf/inch to approximately 3000 gf/inch.

For example, the adhesive strength of the first portion H may be 2000 gf/inch, 3000 gf/inch or 4000 gf/inch, and the adhesive strength of the second portion of the adhesive layer 4 may be 1500 gf/inch, 2000 gf/inch, 2500 gf/inch or 3000 gf/inch.

The adhesive strength of the adhesive layer 4 may be measured by using a tensile testing machine.

In some embodiments, the adhesive layer 4 is made of a transparent adhesive material such as optically clear adhesive (OCA) or optically clear resin (OCR). The light transmittance of the adhesive layer 4 is greater than or equal to approximately 93%, and a haze of the adhesive layer 4 is less than or equal to approximately 1%. As a result, a good light transmittance of the flexible display apparatus may be ensured. Here, that "haze" is an important parameter of optical transparency of transparent or translucent materials. The higher the haze, the lower the transparency of the transparent or translucent materials, which means poor light transmittance of the transparent or translucent materials.

In order to ensure a good flexibility of the adhesive layer 4, in some embodiments, a glass transition temperature of the adhesive layer 4 is less than or equal to approximately −30° C., and greater than or equal to approximately −45° C. For example, the glass transition temperature of the adhesive layer 4 is −30° C. or −40° C.

The glass transition temperature refers to a temperature at which the adhesive layer 4 transitions between a glassy state and a high-elastic state. With the glass transition temperature as a dividing line, the adhesive layer 4 is in a hard and brittle glassy state below the glass transition temperature, and is in a robbery and high-elastic state above the glass transition temperature. It can be understood that, in order to ensure that the adhesive layer 4 is in a high-elastic state at various possible operating temperatures (for example, when the flexible display apparatus is used in a cold region, the operating temperature may be very low), the glass transition temperature of the adhesive layer needs to be as low as possible.

For example, the glass transition temperature of the adhesive layer 4 is −30° C. When the flexible display apparatus is used in an environment with a temperature greater than −30° C., the adhesive layer 4 has good flexibility.

On a basis of the flexible display apparatus described above, depending on whether the first portion H completely occupies the bendable region L, two possible implementations are provided herein, as described below.

Figure 5:
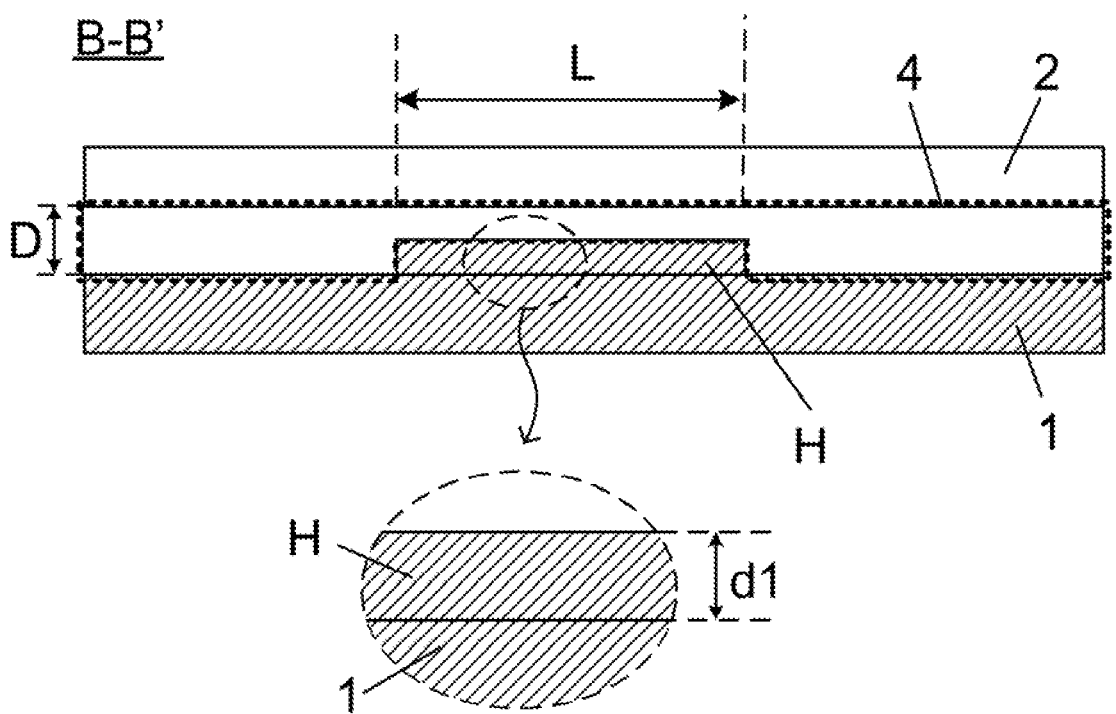
FIG. 5 is a schematic sectional view taken along direction B-B' of the display apparatus in FIG. 4, according to some embodiments.

In a first possible implementation, as shown in FIG. 5, orthographic projections of the first portion H and the bendable region L on the flexible display panel 1 coincide.

Figure 6:
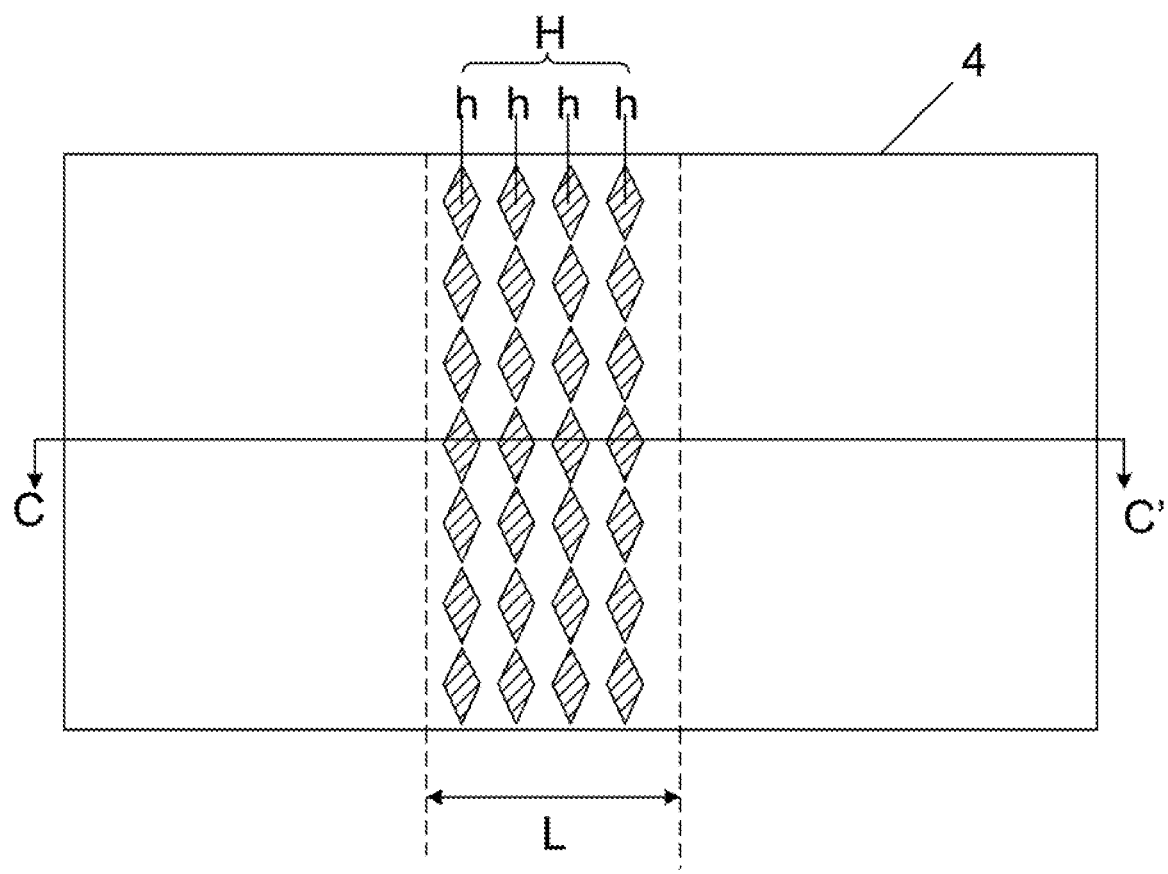
FIG. 6 is a schematic top view of another display apparatus, according to some embodiments.
Figure 7:
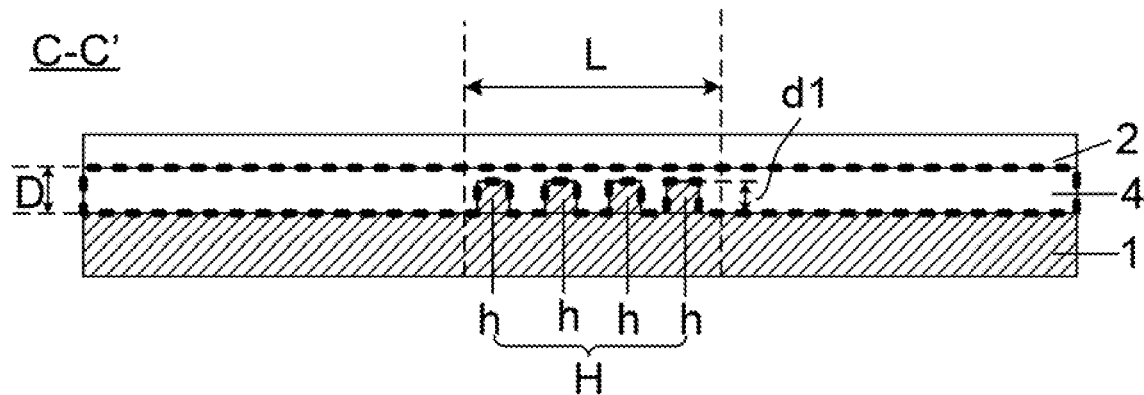
FIG. 7 is a schematic sectional view taken along direction C-C' of the display apparatus in FIG. 6, according to some embodiments.

In a second possible implementation, as shown in FIGS. 6 and 7, the first portion H includes a plurality of sub-portions h arranged at intervals, and orthographic projections of the plurality of sub-portions h on the flexible display panel 1 are within the orthographic projection of the bendable region L on the flexible display panel 1. That is, the orthographic projection of the first portion H on the flexible display panel 1 partially overlaps with the orthographic projection of the bendable region L on the flexible display panel 1.

By arranging the plurality of sub-portions h at intervals, it may be possible to better balance the flexibility and rigidity of the bendable portion located in the bendable region L of the flexible display apparatus. In this way, on the basis of ensuring the flexibility of the bendable portion, it may also be possible to avoid the problem that it is difficult for the flexible display apparatus to restore to the original state after being bent.

Figure 10:
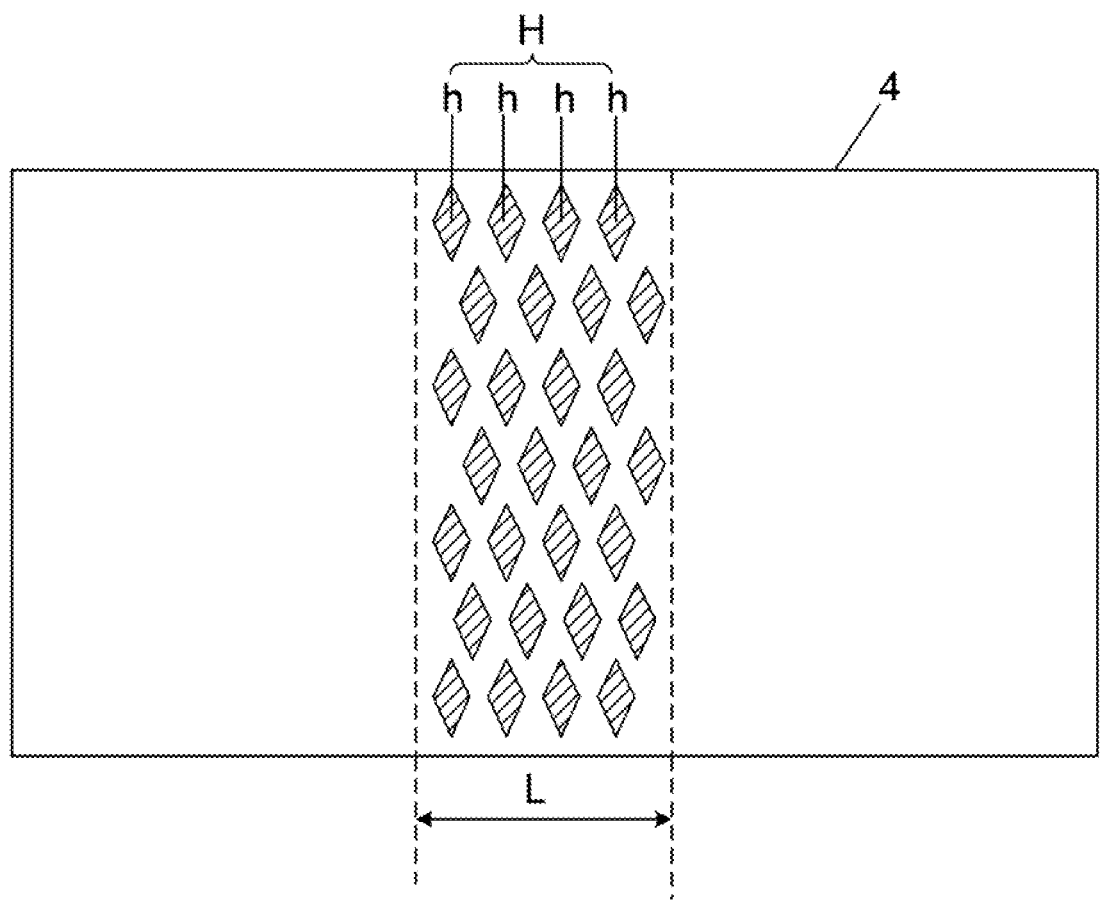
FIG. 10 is a schematic top view of another display apparatus, according to some embodiments of the present disclosure.
Figure 11:
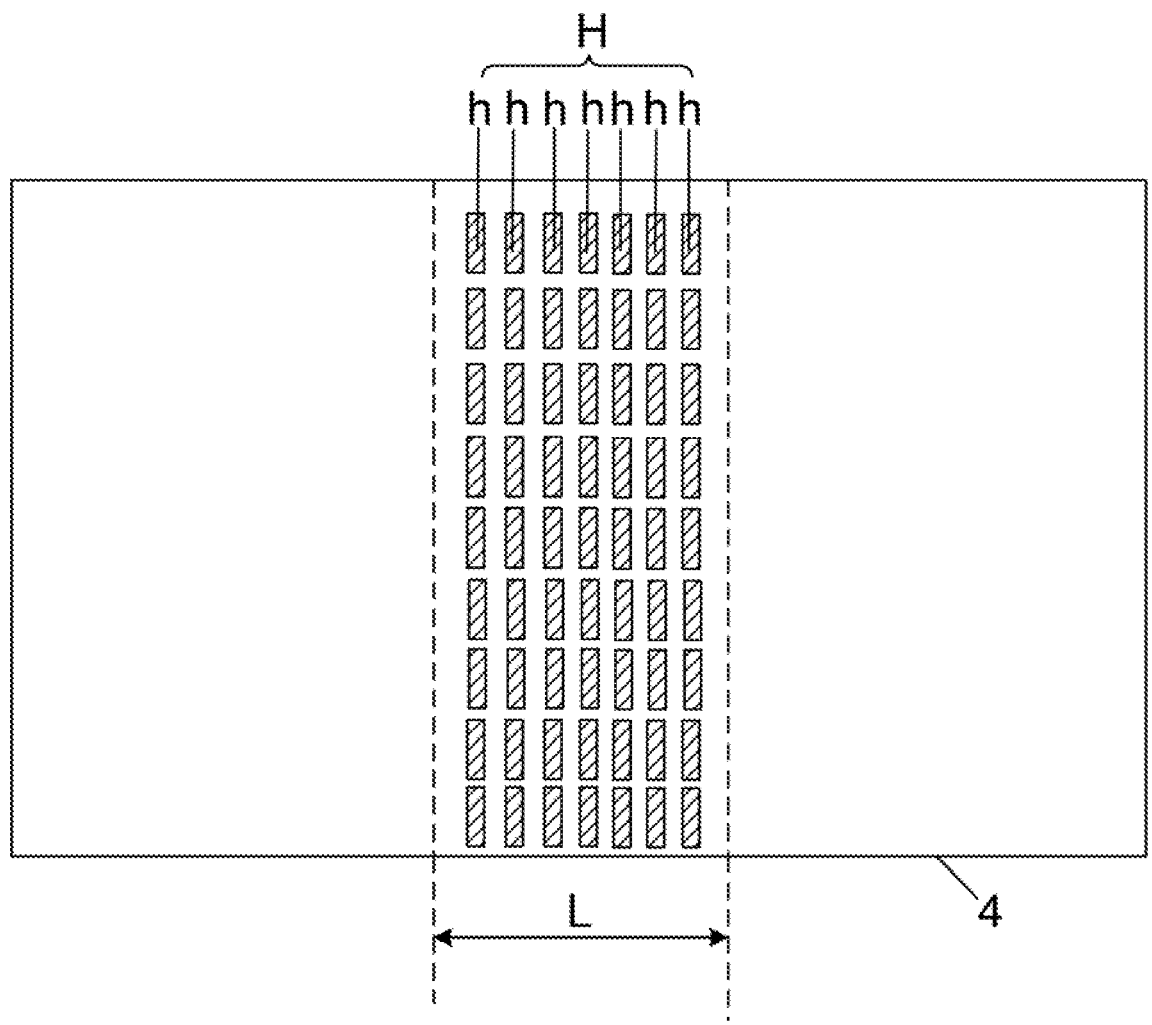
FIG. 11 is a schematic top view of yet another display apparatus, according to some embodiments.

For example, as shown in FIGS. 6, 10 and 11, the plurality of sub-portions h are arranged in an array. Of course, the plurality of sub-portions h may be randomly arranged, or some of the plurality of sub-portions h are arranged in an array. The arrangement of the plurality of sub-portions h is not limited thereto, and can be set according to actual needs.

In some examples, an orthographic projection of at least one sub-portion h on the flexible display panel 1 is in a shape of a quadrangle such as a rhombus or a rectangle. For example, as shown in FIGS. 6 and 10, an orthographic projection of each sub-portion h on the flexible display panel 1 is in the shape of the rhombus. For another example, as shown in FIG. 11, the orthographic projection of each sub-portion h on the flexible display panel 1 is in the shape of the rectangle. Of course, the orthographic projection of each sub-portion h on the flexible display panel 1 may be in other regular shapes or irregular shapes.

The adhesive layer 4 may have a single-layer structure or a multi-layer structure. A position of the first portion H in the adhesive layer is different according to whether the adhesive layer 4 has the single-layer structure or the multi-layer structure.

Figure 8:
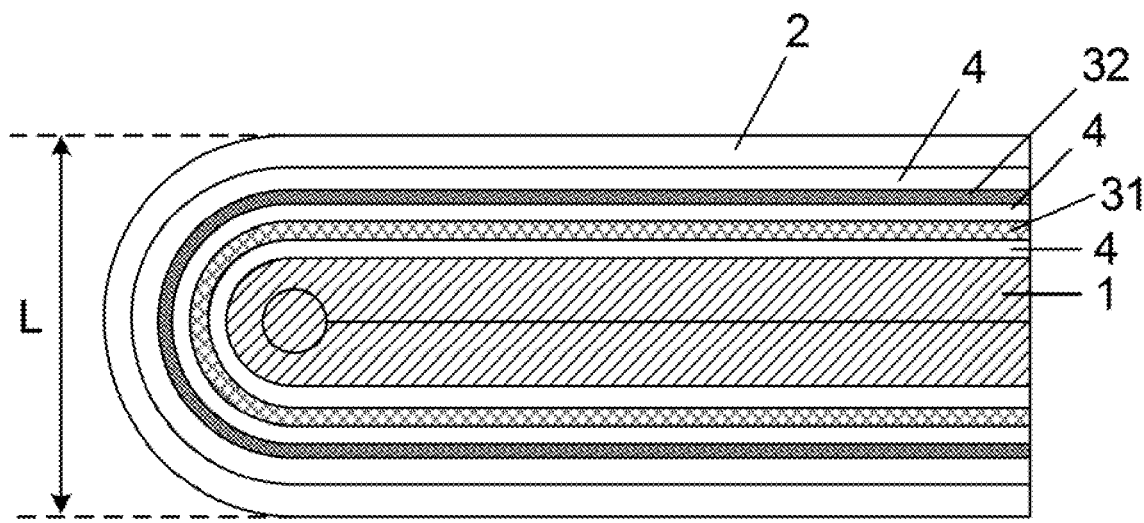
FIG. 8 is a schematic sectional view showing a structure of a flexible display apparatus in a bent state, according to the related art.

In some embodiments, as shown in FIG. 5, the adhesive layer 4 has the single-layer structure and the thickness d1 of the first portion H is less than the thickness D of the adhesive layer 4. The first portion H is located in at least one of an upper half region or a lower half region of the adhesive layer 4 in the bendable region L. For example, the first portion H is provided in both of the upper half region and the lower half region of the adhesive layer 4 in the bendable region L. In this way, no matter whether the flexible display apparatus is bent in a direction as shown in FIG. 8, or in a direction opposite to the direction shown in FIG. 8, it may be possible to avoid the problem that it is difficult for the bendable portion of the flexible display apparatus to restore to the original state after being bent. For another example, as shown in FIG. 5, the first portion H is located in the lower half region of the adhesive layer 4.

Figure 12:
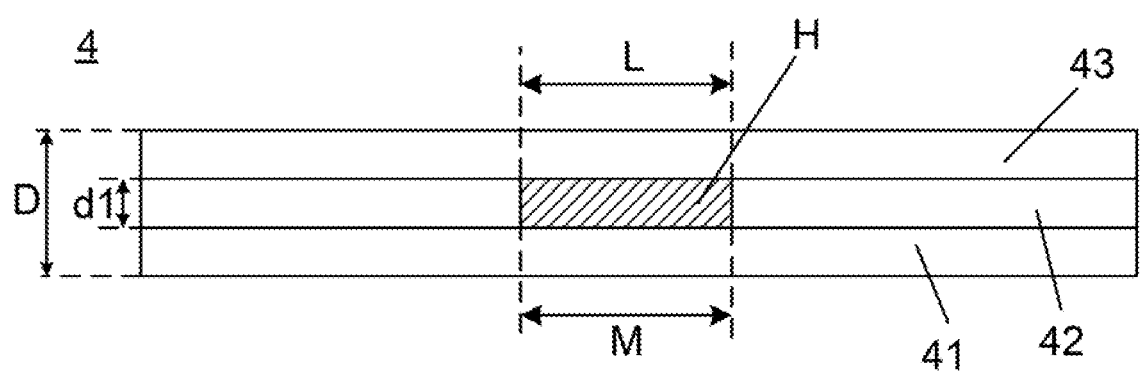
FIG. 12 is a schematic sectional view of an adhesive layer, according to some embodiments.

In some other embodiments, as shown in FIG. 12, the adhesive layer 4 has the multi-layer structure and includes a plurality of adhesive sub-layers (for example, a first sub-layer 41, a second sub-layer 42 and a third sub-layer 43) that are stacked on top of one another, and at least one of the plurality of adhesive sub-layers includes the first portion H.

Figure 13:
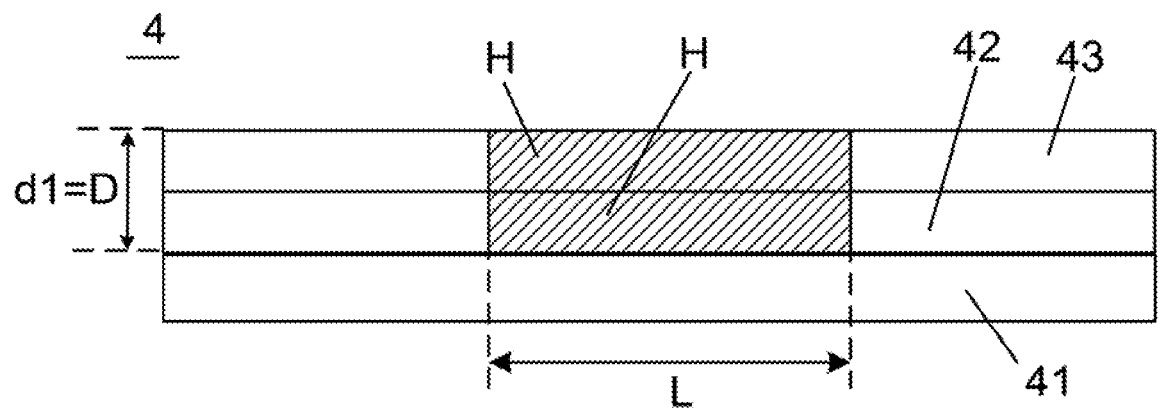
FIG. 13 is a schematic sectional view of another adhesive layer, according to some embodiments.

For example, FIG. 12 shows a case where only the second adhesive sub-layer 42 includes the first portion H. For another example, FIG. 13 shows a case where both of the second adhesive sub-layer 42 and the third adhesive sub-layer 43 include the first portions H.

In some examples, the adhesive layer 4 includes a plurality of adhesive sub-layers that are stacked on top of one another, and at least one of the plurality of adhesive sub-layers includes the first portion H. In a case where only one of the plurality of adhesive sub-layers includes the first portion H, the first portion H may include a plurality of sub-portions h. In a case where two or more of the plurality of adhesive sub-layers include the first portion H, at least one of the first portions H may include a plurality of sub-portions h. With regard to the shape and arrangement of the sub-portions h, reference may be made to the above related description, and details will not be repeated.

In some examples, at least one adhesive sub-layer that includes the first portion H including a plurality of sub-portions h, and at least one adhesive sub-layer that includes the first portion H not including a plurality of sub-portions h are arranged alternately. For example, one adhesive sub-layer that includes the first portion H including a plurality of sub-portions h, and one adhesive sub-layer that includes the first portion H not including a plurality of sub-portions h are arranged alternately. For another example, two adhesive sub-layers (each of which includes the first portion H including a plurality of sub-portions h) and two adhesive sub-layers (each of which includes the first portion H not including a plurality of sub-portions h) are arranged alternately. Through the above arrangement manner, it may be possible to better balance the flexibility and rigidity of the bendable portion located in the bendable region L of the flexible display apparatus. In this way, on the basis of ensuring the flexibility of the bendable portion, it may also be possible to avoid the problem that it is difficult for the flexible display apparatus to restore to the original state after being bent.

In some other examples, at least one adhesive sub-layer that includes the first portion H including a plurality of sub-portions h, and at least one adhesive sub-layer that does not include the first portion H are arranged alternately; or, at least one adhesive sub-layer that includes the first portion H not including a plurality of sub-portions h, and at least one adhesive sub-layer that does not include the first portion H are arranged alternately; or, the three kinds of sub-layers are arranged alternately.

Figure 14:
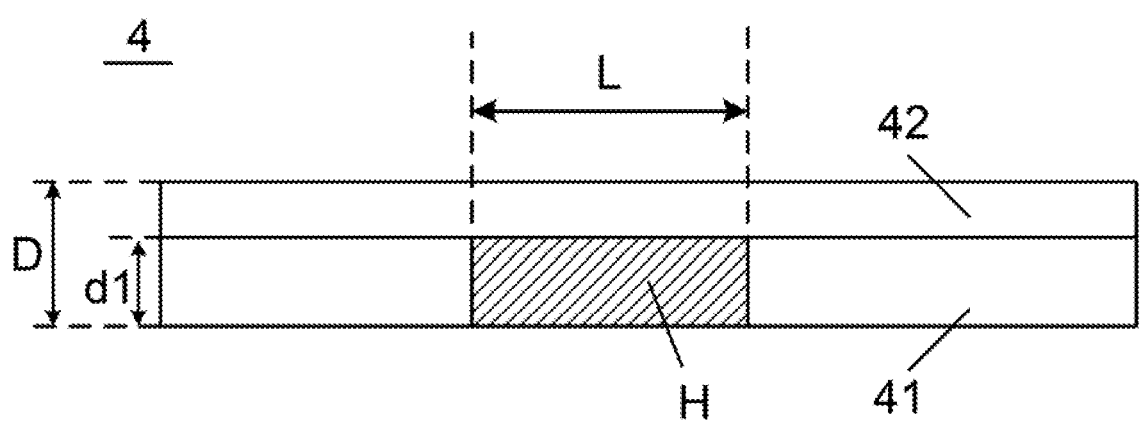
FIG. 14 is a schematic sectional view showing a structure of yet another adhesive layer, according to some embodiments.
Figure 15:
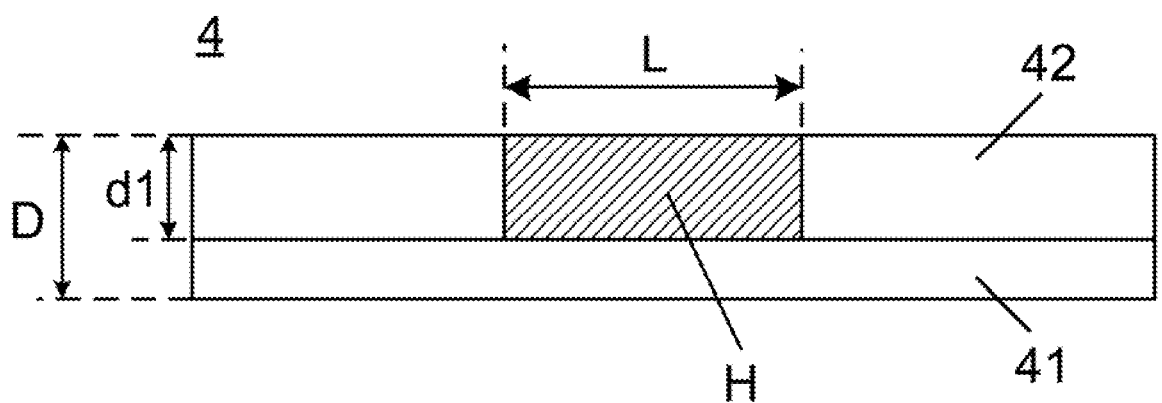
FIG. 15 is a schematic sectional view of yet another adhesive layer, according to some embodiments.

In some examples, as shown in FIGS. 14 and 15, the adhesive layer 4 has a two-layer structure and includes the first adhesive sub-layer 41 and the second adhesive sub-layer 42 that are stacked on top of one another. A total thickness D of the first adhesive sub-layer 41 and the second adhesive sub-layer 42 is less than or equal to approximately 100 microns, and greater than or equal to approximately 15 microns. In a case where the adhesive layer with the total thickness D less than or equal to approximately 100 microns and greater than or equal to approximately 15 microns is used in the flexible display apparatus, it may be easy for the flexible display apparatus to realize a folding function.

In some examples, as shown in FIG. 14, the first adhesive sub-layer 41 includes the first portion H, and the thickness of the first adhesive sub-layer 41 is greater than the thickness of the second adhesive sub-layer 42. The thickness of the second adhesive sub-layer 42 may be in a range from approximately 5 microns to approximately 15 microns. In this way, it may be guaranteed that there is enough space in the first adhesive sub-layer 41 to accommodate the first portion H. Therefore, it may be possible to ensure that the bendable portion located in the bendable region L of the flexible display apparatus is rigid enough to make the flexible display apparatus restore to the original state after being bent.

In this case, for example, the thickness of the second adhesive sub-layer 42 may be 5 microns, 7 microns, 9 microns, 11 microns, 13 microns or 15 microns.

In some other examples, as shown in FIG. 15, the second adhesive sub-layer 42 includes the first portion H, and the thickness of the second adhesive sub-layer 42 is greater than the thickness of the first adhesive sub-layer 41. The thickness of the first adhesive sub-layer 41 may be in a range from approximately 5 microns to approximately 15 microns. In this way, it may be guaranteed that there is enough space in the second adhesive sub-layer 42 to accommodate the first portion H. Therefore, it may be possible to ensure that the bendable portion located in the bendable region L of the flexible display apparatus is rigid enough to make the flexible display apparatus restore to the original state after being bent.

In this case, for example, the thickness of the first adhesive sub-layer 41 may be 5 microns, 7 microns, 9 microns, 11 microns, 13 microns or 15 microns.

Some embodiments of the present disclosure provide a method of manufacturing the flexible display apparatus described above, and the method includes the following steps.

As shown in FIGS. 1B and 5, the at least one adhesive layer 4 which includes the first portion H and the second portion is formed. Then, the at least two flexible elements are bonded through the at least one adhesive layer 4. It will be noted that FIG. 1B takes at least two flexible elements including the flexible display panel 1, the protective layer 2, the optical film 31 and the touch layer 32 as an example.

For example, one of the at least one the adhesive layer 4 is formed on at least one of the at least two flexible elements (for example, the flexible display panel 1 and the at least one flexible layer; or at least two flexible layers).

It can be understood that the at least one adhesive layer 4 may be formed on a release liner. In this case, during the bonding of two flexible elements, the adhesive layer 4 is first peeled from the release liner, then the adhesive layer 4 is adhered to one of the two flexible elements, and then the two flexible elements are bonded by the adhesive layer 4.

The step of forming the at least one adhesive layer 4 includes forming the first portion H through curing by using energy irradiation. As shown in FIG. 5, the flexible display apparatus has the bendable region L. The adhesive layer 4 includes the first portion H in the bendable region L. The first portion H is formed in at least part of the bendable region L During the formation of the adhesive layer 4, the first portion H of the adhesive layer 4 is formed through curing by using energy irradiation (such as heat irradiation, light irradiation or radiation irradiation), so that at a same temperature, the storage modulus of the first portion H obtained after curing is greater than the storage modulus of the second portion of the adhesive layer 4, and a thickness of the first portion H is less than or equal to a thickness of the adhesive layer 4.

In some embodiments, in a process of forming the adhesive layer 4, polymerization of a polymer material containing active functional groups in a material used for forming the adhesive layer 4 may be initiated by, for example, UV light, so as to form the first portion H in the adhesive layer 4. Or, polymerization of the polymer material containing active functional groups in the material used for forming the adhesive layer 4 may be initiated by, for example, an electron beam, so as to form the first portion H.

Figure 16:
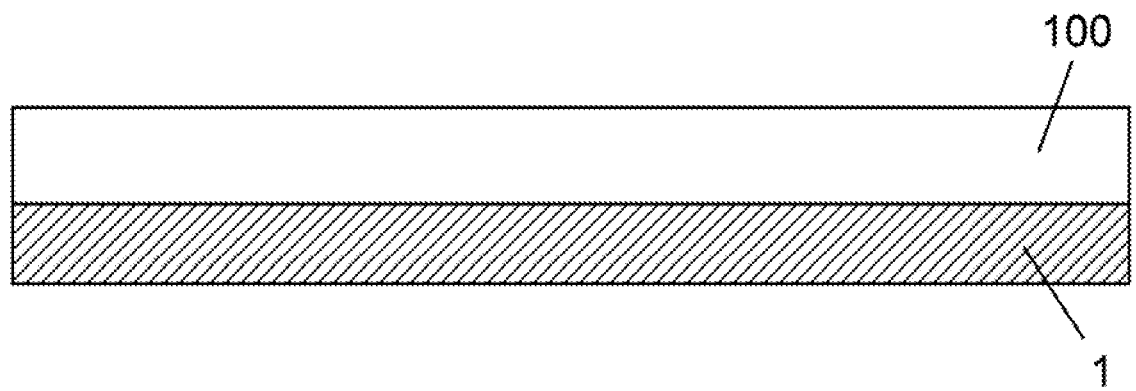
FIGS. 16 to 18 are schematic diagrams showing how to form an optical adhesive layer, according to some embodiments.
Figure 17:
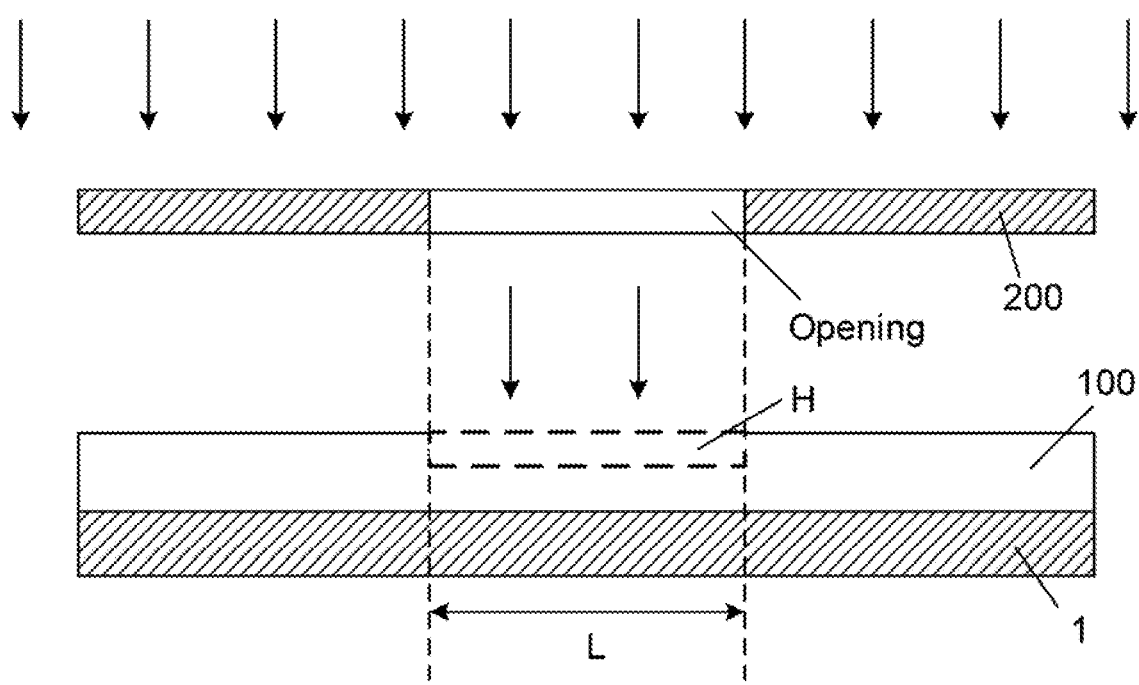

On the above basis, in some embodiments, as shown in FIGS. 16 and 17, forming the first portion H in the adhesive layer 4 through curing by using energy irradiation includes: forming an optical adhesive film 100 on at least one of the flexible display panel 1 and one of the at least one flexible layer; and curing a portion of the optical adhesive film 100 through UV curing by using a mask 200 having at least one opening which corresponds to the first portion to be formed, so as to form the first portion H.

It will be noted that in a case where the mask 200 is used, a region of the optical adhesive film 100 corresponding to the second portion to be formed is shielded by a shielding portion of the mask 200. The region of the optical adhesive film 100 corresponding to the first portion to be formed is exposed by at least one opening of the mask 200.

It can be understood that by using the shielding object such the mask, regions of the optical adhesive film 100 corresponding to the first portion to be formed and the second portion to be formed may be treated with different curing conditions, and thus the first portion H may have a different storage modulus from the second portion.

The rigidity of the first portion H in the flexible display apparatus manufactured by the above method may be improved. Therefore, the rigidity of the bendable portion located in the bendable region L may be improved. As a result, it may be easier for the bendable portion of the flexible display apparatus to restore to the original state after being bent.

It will be noted that depending on whether the adhesive layer 4 has a single-layer structure or a multi-layer structure, the manufacturing methods thereof may be different.

In some embodiments, as shown in FIG. 5, in a case where the adhesive layer 4 has a single-layer structure and the thickness d1 of the first portion H is less than the thickness D of the adhesive layer 4, the first portion H is formed in at least one of the upper half region and the lower half region of the adhesive layer 4. The method will be described below with reference to FIG. 18 by taking the first portion H located in the upper half region of the adhesive layer 4 as an example. The method includes the following steps.

In S21, as shown in FIG. 16, an optical adhesive film 100 is formed, for example, on the flexible display panel 1 or on one of the at least one flexible layer (such as the protective layer 2 or the touch layer 32).

In some embodiments, forming the optical adhesive film 100 includes: forming a base material layer; and adding different proportions of photo initiators to a portion of the base material layer corresponding to the first portion to be formed and a portion of the base material layer corresponding to the second portion to be formed respectively.

The base material layer of the optical adhesive film 100 may include at least one of acrylic resin, polyurethane resin, epoxy polyester resin or silicone resin.

The portions of the optical adhesive film 100 corresponding to the first portion to be formed and the second portion to be formed include the different proportions of photo initiators respectively. For example, the proportion of photoinitiator added to the portion corresponding to the first portion to be formed is higher than the proportion of photoinitiator added to the portion corresponding to the second portion to be formed. In this way, in a case where conditions of a subsequent photocuring process are constant, a curing degree of the first portion H formed by the photocuring process may be higher than that of the second portion.

In other words, the storage modulus of the first portion may be greater than the storage modulus of the second portion.

The photoinitiator may include at least one of 1-hydroxycyclohexylphenylketone, benzoin dimethyl ether, 2-hydroxy-2-methylpropiophenone, benzophenone, 2,4,6-trimethylanisole diphenyl phosphine oxide, methyl phenylglyoxylate, phenyl bis (2,4,6-trimethylbenzoyl)-phosphine oxide, or isopropyl thioxanthone.

In S22, as shown in FIG. 17, the region of the optical adhesive film 100 corresponding to the first portion to be formed is cured by being irradiated from top to bottom during the photocuring process to form the first portion H in the upper half region of the adhesive film 4.

For example, as showed in FIG. 17, the first optical adhesive slayer 100 is exposed to UV light when being masked by the mask 200 having at least one opening which corresponds to the first portion to be formed. The upper surface of the region of the optical adhesive film 100 corresponding to the first portion to be formed is exposed to UV light through a corresponding opening of the mask 200.

Figure 18:
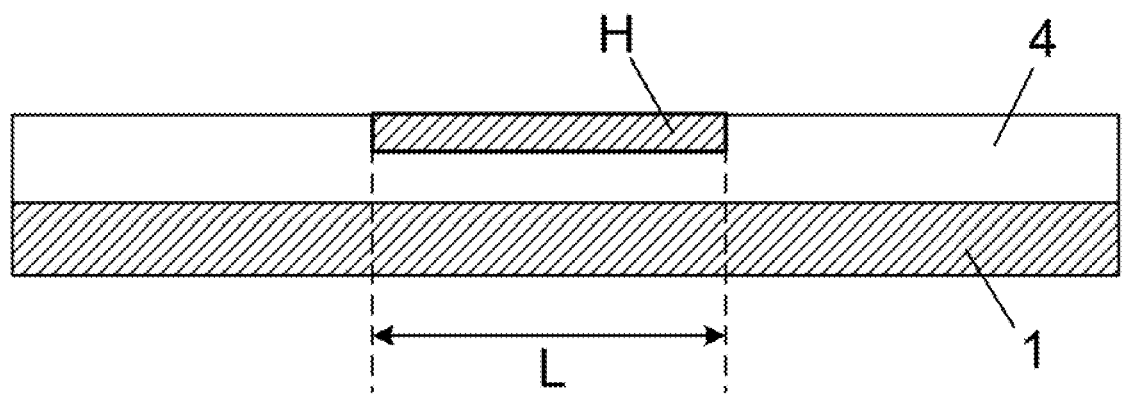

It can be understood that by controlling the radiation energy received, the thickness of the first portion H may be controlled, and thus the adhesive layer 4 shown in FIG. 18 may be formed.

In some embodiments, the portion of the optical adhesive film 100 is cured through UV curing by using the mask 200 in an inert gas atmosphere, so as to form the first portion H. For example, the inert gas may be nitrogen.

Figure 19:
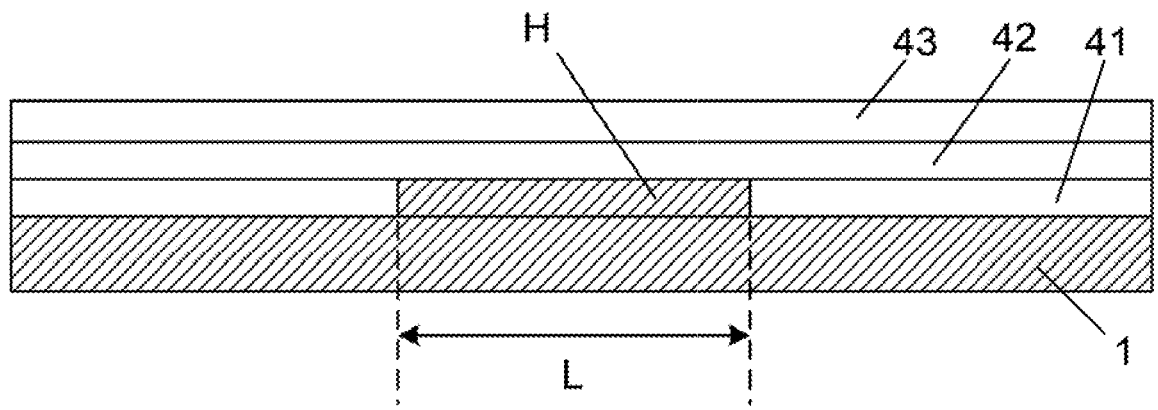
FIG. 19 is a schematic diagram showing another way of forming an optical adhesive film on a flexible display panel, according to some embodiments.

In some embodiments, as shown in FIGS. 12 and 19, in a case where the adhesive layer 4 has a multi-layer structure and includes a plurality of adhesive sub-layers, for example, a first adhesive sub-layer 41, a second adhesive sub-layer 42 and a third adhesive sub-layer 43 that are stacked on top of one another, the first portion H is formed in at least one of the adhesive sub-layers.

A method of forming the adhesive layer 4 will be exemplarily described in detail below with reference to FIG. 19. In FIG. 19, the adhesive layer is formed on the flexible display panel 1. The adhesive layer includes three adhesive sub-layers, i.e., the first adhesive sub-layer 41, the second adhesive sub-layer 42 and the third adhesive sub-layer 43, and the first portion H is formed in the first adhesive sub-layer 41.

Figure 20:
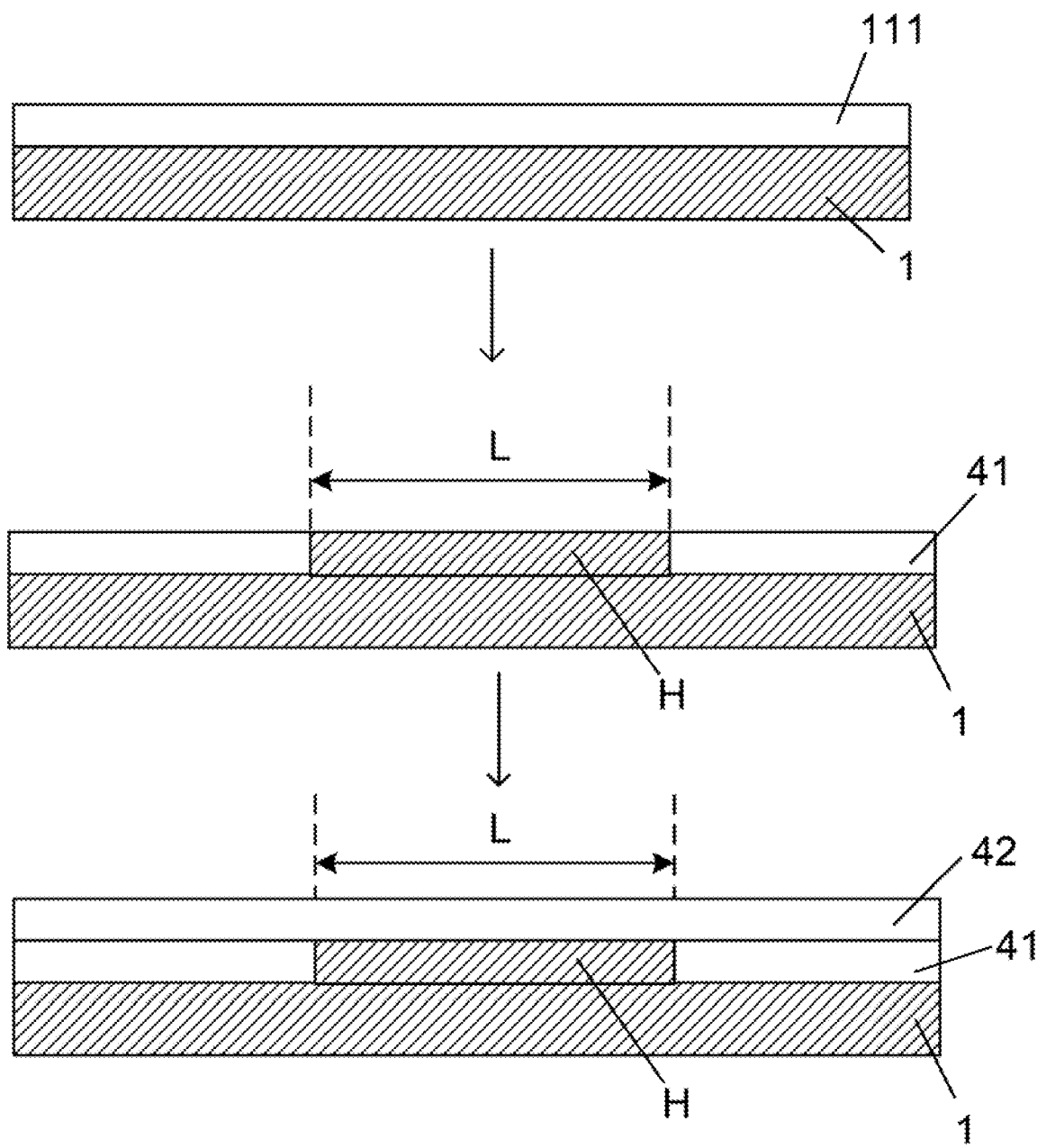
FIG. 20 is a schematic diagram showing how to form another adhesive layer, according to some embodiments.

In S31, as shown in FIG. 20, a first adhesive sub-film 111 is formed on the flexible display panel 1.

It will be noted that the first adhesive sub-film 111 may be formed on one of the at least one flexible layer (such as the protective layer 2 or the touch layer 32) of the flexible display apparatus. For example, the first adhesive sub-layer 111 is formed on the surface of the protective layer 2 or the surface of the touch layer 32.

In S32, a region of the first optical adhesive sub-film 111 corresponding to the first portion to be formed is cured by energy irradiation, so that the first portion H is formed.

Figure 21:
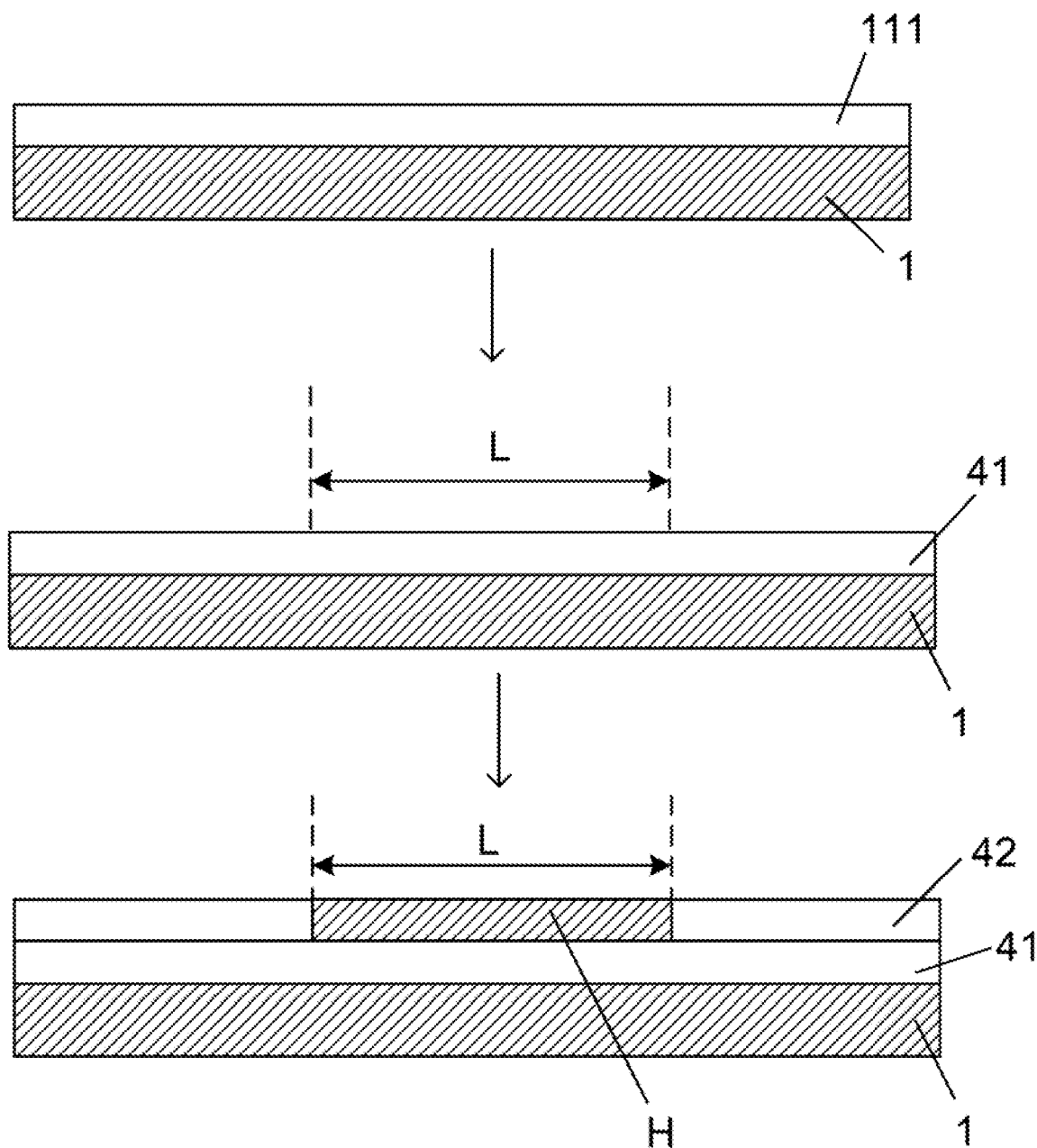
FIG. 21 is a schematic diagram showing how to form yet another adhesive layer, according to some embodiments.

For example, the first optical adhesive sub-film 111 is exposed to UV light when being masked by the mask 200. The region of the first optical adhesive sub-film 111 corresponding to the first portion to be formed is exposed to UV light through a corresponding opening of the mask 200 so as to be cured. It can be understood that by controlling the radiation energy received, the thickness of the first portion H may be controlled, and thus the first adhesive sub-layer 41 shown in FIG. 21 may be formed.

In S33, a second adhesive sub-layer 42 and a third adhesive sub-layer 43 are formed in sequence on the first adhesive sub-layer 41 to obtain the structure shown in FIG. 19.

It will be noted that the above description does not limit an order of performing the steps, which can be adjusted by those skilled in the art according to actual needs.

The forgoing descriptions are merely specific implementation manners of the present disclosure, but the protection scope of the present disclosure is not limited thereto. A person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A flexible display apparatus, comprising:
   at least two flexible elements; and
   at least one adhesive layer bonding the at least two flexible elements,
   wherein the flexible display apparatus has a bendable region, each adhesive layer includes a first portion in the bendable region and a second portion, at least part of the second portion is located outside the bendable region; the adhesive layer is configured such that at a same temperature, a storage modulus of the first portion is greater than a storage modulus of the second portion; and a thickness of the first portion is less than or equal to a thickness of the adhesive layer, and
   wherein the first portion includes a plurality of sub-portions arranged at intervals, and orthographic projections of the plurality of sub-portions on one of the at least two flexible elements are within an orthographic projection of the bendable region on the one of the at least two flexible elements.

2. The flexible display apparatus according to claim 1, wherein the at least two flexible elements include at least three flexible elements, and the at least one adhesive layer includes a plurality of adhesive layers, and
   wherein every two adjacent flexible elements are provided with one of the plurality of adhesive layers therebetween.

3. The flexible display apparatus according to claim 1, wherein the plurality of sub-portions are arranged in an array.

4. The flexible display apparatus according to claim 1, wherein one of the at least one adhesive layer has a single-layer structure and the thickness of the first portion is less than the thickness of the adhesive layer; and
   the first portion is located in at least one of an upper half region and a lower half region of the one of the at least one adhesive layer.

5. The flexible display apparatus according to claim 1, wherein one of the at least one adhesive layer has a multi-layer structure and includes a plurality of adhesive sub-layers that are stacked along a thickness direction of the adhesive layer; and
   at least one adhesive sub-layer includes the first portion.

6. The flexible display apparatus according to claim 5, wherein in the plurality of adhesive sub-layers, an adhesive sub-layer including the first portion and an adhesive sub-layer not including the first portion are arranged alternately.

7. The flexible display apparatus according to claim 5, wherein
   the plurality of adhesive sub-layers include a first adhesive sub-layer and a second adhesive sub-layer that are stacked along the thickness direction of the adhesive layer;
   one of the first adhesive sub-layer and the second adhesive sub-layer includes the first portion, and a sum of thicknesses of the first adhesive sub-layer and the second adhesive sub-layer is less than or equal to approximately 100 microns, and greater than or equal to approximately 15 microns.

8. The flexible display apparatus according to claim 7, wherein
   the first adhesive sub-layer includes the first portion, a thickness of the first adhesive sub-layer is greater than a thickness of the second adhesive sub-layer, and a thickness of the second adhesive sub-layer is in a range from approximately 5 microns to approximately 15 microns; or
   the second adhesive sub-layer includes the first portion, the thickness of the second adhesive sub-layer is greater than the thickness of the first adhesive sub-layer, and the thickness of the first adhesive sub-layer is in a range from approximately 5 microns to approximately 15 microns.

9. The flexible display apparatus according to claim 1, wherein
   the first portion is configured such that the storage modulus of the first portion is in a range from approximately 100 KPa to approximately 200 KPa at 25° C.; and
   the second portion is configured such that the storage modulus of the second portion is in a range from approximately 20 KPa to approximately 100 KPa at 25° C.

10. The flexible display apparatus according to claim 1, wherein an adhesive strength of the first portion is greater than an adhesive strength of the second portion.

11. The flexible display apparatus according to claim 10, wherein
    the adhesive strength of the first portion is in a range from approximately 2000 gf/inch to approximately 4000 gf/inch; and
    the adhesive strength of the second portion is in a range from approximately 1500 gf/inch to approximately 3000 gf/inch.

12. The flexible display apparatus according to claim 1, wherein
    a glass transition temperature of the adhesive layer is less than or equal to approximately -30° C., and greater than or equal to approximately −45° C.

13. The flexible display apparatus according to claim 1, wherein
    a light transmittance of the adhesive layer is greater than or equal to approximately 93% and a haze of the adhesive layer is less than or equal to approximately 1%.

14. A method of manufacturing the flexible display apparatus according to claim 1, the method comprising:
    forming the at least one adhesive layer which includes the first portion and the second portion, the first portion including the plurality of sub-portions arranged at intervals; and
    bonding the at least two flexible elements through the at least one adhesive layer,
    wherein the orthographic projections of the plurality of sub-portions on the one of the at least two flexible elements are within the orthographic projection of the bendable region on the one of the at least two flexible elements, and
    wherein forming the at least one adhesive layer includes:
      forming the first portion through curing by using energy irradiation, so that at a same temperature, a storage modulus of the first portion is greater than a storage modulus of the second portion, and a thickness of the first portion is less than or equal to a thickness of the adhesive layer.

15. The method according to claim 14, wherein forming the first portion through curing by using energy irradiation includes:
    forming an optical adhesive film; and
    curing a portion of the optical adhesive film through UV curing, so as to form the first portion.

16. The method according to claim 15, wherein curing a portion of the optical adhesive film through UV curing includes:
    curing the portion of the optical adhesive film through UV curing by using a mask having at least one opening which corresponds to the first portion to be formed in an inert gas atmosphere, so as to form the first portion.

17. The method according to claim 15, wherein forming the optical adhesive film includes:
    forming a base material layer; and
    adding different proportions of photo initiators to a portion of the base material layer corresponding to the first portion to be formed and a portion of the base material layer corresponding to the second portion to be formed respectively, wherein
    the base material layer includes at least one of acrylic resin, polyurethane resin, epoxy polyester resin, or silicone resin; and
    the photo initiators include at least one of 1-hydroxycyclohexylphenylketone, benzoin dimethyl ether, 2-hydroxy-2-methylpropiophenone, benzophenone, 2,4,6-trimethylanisole diphenyl phosphine oxide, methyl phenylglyoxylate, phenyl bis (2,4,6-trimethylbenzoyl)-phosphine oxide, or isopropyl thioxanthone.

18. The method according to claim 14, wherein forming one of the at least one adhesive layer includes:
    forming a first optical adhesive sub-film;
    curing a portion of the first optical adhesive sub-film corresponding to the first portion to be formed by energy irradiation to form a first adhesive sub-layer including the first portion; and
    forming a second adhesive sub-layer on the first adhesive sub-layer.

19. The method according to claim 14, wherein forming one of the at least one adhesive layer includes:
    forming a first optical adhesive sub-layer;
    forming a second optical adhesive sub-film on the first adhesive sub-layer; and
    curing a portion of the second optical adhesive sub-film corresponding to the first portion to be formed by energy irradiation to form a second adhesive sub-layer including the first portion.

* * * * *